United States Patent
Miyoshi et al.

(10) Patent No.: US 6,258,635 B1
(45) Date of Patent: Jul. 10, 2001

(54) REMOVAL OF METAL CONTAMINANTS FROM THE SURFACE OF A SILICON SUBSTRATE BY DIFFUSION INTO THE BULK

(75) Inventors: Kousuke Miyoshi; Seiichi Shishiguchi, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/164,970

(22) Filed: Oct. 1, 1998

(30) Foreign Application Priority Data

Oct. 31, 1997 (JP) .................................................. 9-300248

(51) Int. Cl.[7] .................... H01L 21/335; H01L 21/322
(52) U.S. Cl. ..................... 438/143; 438/476; 438/477; 438/473; 438/770
(58) Field of Search .................................. 438/143, 471, 438/770, 473, 476, 477, 769

(56) References Cited

U.S. PATENT DOCUMENTS

| | | | |
|---|---|---|---|
| 5,436,498 | * | 7/1995 | Lesk . |
| 5,506,176 | * | 4/1996 | Takizawa . |
| 5,786,277 | * | 7/1998 | Yamamoto . |
| 5,851,892 | * | 12/1998 | Lojek et al. . |
| 5,904,574 | * | 5/1999 | Nishijima . |

FOREIGN PATENT DOCUMENTS

| | | | |
|---|---|---|---|
| 468526 | 3/1992 | (JP) | .............................. H01L/21/304 |
| 7247197 | 9/1995 | (JP) | ................................. C30B/29/06 |
| 951001 | 2/1997 | (JP) | .............................. H01L/21/322 |
| 997789 | 4/1997 | (JP) | .............................. H01L/21/316 |

OTHER PUBLICATIONS

Extended abstracts of the 1996 International Conference on Solid State Devices and Materials, 1996, pp. 362–364, Yokohama.

"The Contrastive Behaviour of Fe and Cu Impurities in Si Crystals" Abe et al.

Defect Control in Semiconductors; Elsevier Science Publishers; 1990: pp. 297–303.

* cited by examiner

*Primary Examiner*—Chandra Chaudhari
*Assistant Examiner*—Stephen W. Smoot
(74) *Attorney, Agent, or Firm*—Hayes, Soloway, Hennessey, Grossman & Hage, PC

(57) ABSTRACT

A method of manufacturing a semiconductor device has a step whereby, when forming a gate oxide film, a thin oxide film is left on a silicon substrate onto which it is formed and whereby a heavy metal at the surface of the silicon substrate is diffused into the substrate, and a step of forming a gate oxide film onto the silicon substrate.

9 Claims, 16 Drawing Sheets

103 SILICON NITRIDE FILM
102 SILICON OXIDE FILM
101 SILICON SUBSTRATE

104 PHOTORESIST PATTERN
103 SILICON NITRIDE FILM
102 SILICON OXIDE FILM
101 SILICON SUBSTRATE

108 HEAVY METAL
106 ELEMENT SEPARATION REGION
101 SILICON SUBSTRATE

109 NITROGEN ATMOSPHERE
101 SILICON SUBSTRATE
108 HEAVY METAL

REMOVAL OF METAL CONTAMINANTS FROM THE SURFACE OF A SILICON SUBSTRATE BY DIFFUSION INTO THE BULK

BACKGROUND OF THE INVENTION

1. Field of the Invention

The present invention relates to a method for manufacturing a semiconductor device, and more specifically to a method for manufacturing a semiconductor device in which heavy-metal element contamination in the surface of a silicon substrate is caused to diffuse into the substrate, thereby reducing the contamination concentration at the surface of the substrate.

2. Description of Related Art

Heavy metal contamination that occurs in the process of manufacturing a semiconductor device is known to cause deterioration of the electrical characteristics (such as the gate oxide film reliability and junction leakage characteristics) of the semiconductor device. In recent years, with the shrinking of feature sizes and increasing in the level of integration of semiconductor devices, gate oxide film thicknesses in MOS transistors are getting progressively thinner. Thus, even minute quantities of heavy metal contamination can cause deterioration in the initial breakdown voltage and TDDB (time dependent dielectric breakdown) characteristics of a gate oxide film. According to a report in Y. Shiramizu et al in "Extended Abstracts of the 1996 International Conference on Solid State Devices and Materials, Yokohama" (pp. 362–364 (1996)), deterioration of the TDDB characteristics of an 8-nm gate oxide film is observed even with contamination to a level of $1 \times 10^{10}$ atoms/cm$^2$ of iron, which is a typical heavy metal. According to a report in "The National Tech. Road Map for Semiconductors 1994" (Semiconductor Industry Association, 1994), in a semiconductor device with a design rule at the level of 0.18 μm, it is necessary to keep the heavy metal contamination level existing at the surface of the semiconductor substrate to below $1 \times 10^{10}$ atoms/cm$^2$. With this situation as a backdrop, advances have been made in improving the clean level of semiconductor device manufacturing processes, and in silicon substrate cleaning technologies, and it is possible, using a fluid mixture of acid-hydrogen peroxide, to achieve a clean silicon substrate surface to a level of $1 \times 10^{10}$ atoms/cm$^2$.

On an actual semiconductor manufacturing line, however, because there are many metals that are used in reaction chambers, gas piping, and transporting mechanisms of manufacturing equipment, it is possible that heavy metal contamination might for some reason enter the cleaning fluid, or that heavy metal contamination can occur after cleaning and before gate oxidation.

If gate oxidation is performed in this condition, there is the problem of heavy metals being taken into the gate oxide film, this leading to a deterioration of the gate oxide film material, which results in a lowering of device reliability and a lowering of the yield.

Technology to solve such problems as noted above is described, for example, in the Japanese Unexamined Patent Publication (KOKAI) H4-68526, which describes the exposure of a semiconductor substrate to an atmosphere containing hydrogen before formation of a prescribed film on the substrate so as to clean the substrate.

This technology is shown in the process diagrams of FIG. 15 through FIG. 17.

First, as shown in FIG. 15A, a silicon substrate 1 is immersed in an aqueous solution 2 that contains a appropriate chemical substance so as to remove particles and heavy metal contamination or the like that have become attached to the silicon substrate. Next, as shown in FIG. 15B, the silicon substrate 1 is transported into an oxidation oven 3, which is filled with an inert gas such as nitrogen, so that there is no silicon oxide film growth. Then, as shown in FIG. 16A, hydrogen gas is brought into the oxidation oven, to replace the atmosphere in the oven with a hydrogen atmosphere 4, after which silicon substrate 1 is left in the oven 3, which is filled with hydrogen, for a prescribed amount of time, thereby cleaning the substrate with hydrogen. Then, as shown in FIG. 16B, an inert gas that does not react with hydrogen, such as nitrogen 5, is brought into the oxidation oven, to replace the atmosphere in the oven with a nitrogen atmosphere. Additionally, as shown in FIG. 17, oxygen gas 6 is brought into the oxidation oven 3, to replace the atmosphere in the oven with an oxygen atmosphere, after which a prescribed thermal oxide film 7 is formed on the silicon substrate 1 under prescribed conditions of oxidation.

In the above-described prior art, however, because the surface of the silicon substrate is directly exposed to a hydrogen atmosphere, a reduction reaction with the hydrogen causes an increase in the microroughness in the surface of the silicon substrate. This increase in microroughness causes unevenness in the thickness of the gate oxide film that is formed on the surface of the silicon substrate in a later gate oxide process. As a result, there is a deterioration in the breakdown voltage and reliability of the gate oxide film. Thus, the prior art method was accompanied by the problem of not being able to sufficiently prevent deterioration of device characteristics.

Accordingly, an object of the present invention is to provide a novel method manufacturing a semiconductor device that improves on the problems described above and in particular which removes heavy metal contamination from the surface without causing an increase in microroughness of the surface of the silicon substrate, that is without causing a deterioration of the surface condition, whereby subsequent oxidation can be done to form a high-quality gate oxide film.

SUMMARY OF THE INVENTION

To achieve the above-noted object, the present invention has the basic technical constitution described below.

Specifically, a first aspect of the present invention is a method for manufacturing a semiconductor device having the first step of leaving a thin oxide film on the silicon substrate on which it is formed and diffusing heavy metal contamination on the silicon substrate into the inside of the silicon substrate, and the second step of forming a gate oxide film on the silicon substrate. A second aspect of the present invention is a method for manufacturing a semiconductor substrate having the elements described above for the first aspect of the present invention, wherein the first step is a heat treating step that is performed at a temperature in the range from 800° C. to 900° C. in a nitrogen atmosphere that contains 2% to 5% oxygen. The third aspect of the present invention is a method of manufacturing a semiconductor device in which the first step is a heat treating step that is performed at a temperature range from 800° C. to 1050° C. in a hydrogen atmosphere. A fourth aspect of the present invention is a method of manufacturing a semiconductor device in which the first step is a heat treating step that is performed in a helium atmosphere. A fifth aspect of the present invention is a method of manufacturing a semiconductor device in which the first step is a heat treating step that is performed in an argon atmosphere. A sixth aspect of the present invention is a method of manufacturing a semiconductor device in which the first step and the second step are performed within one and the same reaction chamber. A seventh aspect of the present invention is a method of manufacturing a semiconductor device wherein the above-noted thin oxide film that is left on the substrate is a natural oxide film or an oxide film that is formed by a cleaning fluid that contains hydrogen peroxide. An eight aspect of the present invention is a method of manufacturing a semiconductor device wherein the above-noted cleaning fluid is a fluid mixture that contains at least one member of a group consisting of a fluid mixture of ammonia and hydrogen peroxide, a fluid mixture of sulfuric acid and hydrogen peroxide, and a fluid mixture of hydrochloric acid and hydrogen peroxide.

The present invention is a method for manufacturing a semiconductor device which has the first step of leaving a thin oxide film on a silicon substrate on which it is formed and diffusing heavy metal contamination on the silicon substrate into the inside of the silicon substrate, and the second step of forming a gate oxide film on the silicon substrate, in which, in order to achieve a gate oxide film of good quality, it is important not only to reduce and remove heavy metal contaminating elements which exist on the surface of the substrate to a sufficiently low level immediately before oxidation of the gate film, and also to suppress the occurrence of deterioration (microroughness) of the surface of the silicon substrate before gate film oxidation.

To achieve the above-noted effects in the present invention, before forming an gate oxide film, the method used is one of four: (1) performing heat treating in a nitrogen atmosphere containing a mixture of oxygen of 2% to 5% at a temperature not exceeding 900° C., (2) performing heat treating in an atmosphere of hydrogen at a temperature not exceeding 1050° C., (3) performing heat treating in an atmosphere of helium, or (4) performing heat treating in an atmosphere of argon.

Under the above-noted conditions, it is possible to remove heavy metals from the surface of the substrate, that is, to diffuse them to the inside of the substrate, without causing roughness in the surface of the silicon substrate.

The conditions for each of the above-noted types of heat treating are described in detail below.

First, in the heat treating (1) in a nitrogen atmosphere, it is known that heat treating performed in a 100% nitrogen atmosphere at a temperature of 950° C. or higher, will result in etching of the silicon surface because of the existence of residual oxygen at a level of several ppm or several tens of ppm in the atmosphere. To prevent this phenomenon, therefore, it is necessary to add oxygen to the atmosphere.

However, along with the oxidation of the silicon substrate surface under the above-noted conditions, heavy metal elements existing at the surface will also be oxidized, this causing the heavy metals to remain in the surface of the substrate, making it impossible to remove the heavy metal contamination from the substrate surface. If the temperature is lowered to approximately 900° C., in a 100% nitrogen atmosphere, partial nitriding of the silicon substrate surface occurs, this resulting in non-uniformity in the oxide film thickness when the gate oxide film is subsequently formed. To solve this problem, the present invention includes the study of the addition of a minute amount of oxygen.

As a result, it was discovered that, because of the increase in the oxygen concentration, the nitriding of the silicon substrate was suppressed. However, it was also discovered that when the oxygen concentration exceeds 5%, there is a reduction in the effect of reducing the heavy metal surface contamination. This is because, as in the above case, there is oxidation of the heavy metal itself because of the increase in oxygen concentration, and because of the stabilization of the silicon substrate, diffusion into the substrate becomes difficult.

Therefore, in order to achieve the effect of reducing the heavy metal contamination while also preventing deterioration of the silicon substrate, it is necessary to set the oxygen concentration in the nitrogen atmosphere to 2% to 5% and perform heat treating at a temperature of 900° C. or below (and preferably at no lower than 800° C., from the standpoint of diffusion rate).

Next, in performing heat treating in a hydrogen atmosphere as noted at (2), while the problem of nitriding of the surface, which occurs in a nitrogen atmosphere, does not occur, if heat treating is performed at a high temperature of 1050° C. or greater, natural (chemical) oxygen existing in the surface of the substrate is removed by reduction, this resulting in exposure of the substrate surface. If heat treating is continued under these conditions, microroughness will occur on an active substrate surface.

Therefore, in the case of performing heat treating in a hydrogen atmosphere, it is effective to hold the heat-treating temperature to no greater than 1050° C. (and preferably to no lower than 800° C.), so as to diffuse heavy metals into the inside of the substrate under conditions that do not cause removal of the oxide film by reduction.

In the heat treating in a helium atmosphere or an argon atmosphere, as indicated by (3) and (4) above, because the gas used is itself inert, it is possible to achieve reduction of the heavy metal contamination of the surface without the problem of deterioration of the silicon substrate such as observed with a nitrogen or a hydrogen atmosphere.

By performing the above-noted heat treating before gate oxidation, it is possible to achieve a condition in which there is no heavy metal contamination of the silicon substrate surface and no microroughness and the like caused thereon.

If the gate oxidation is performed thereafter under the above-noted condition, it is possible achieve a gate oxide film of extremely high quality. Using the method of the present invention, therefore, the yield and reliability of a semiconductor device are improved.

DETAILED DESCRIPTION OF THE PREFERRED EMBODIMENTS

Figure 1A:
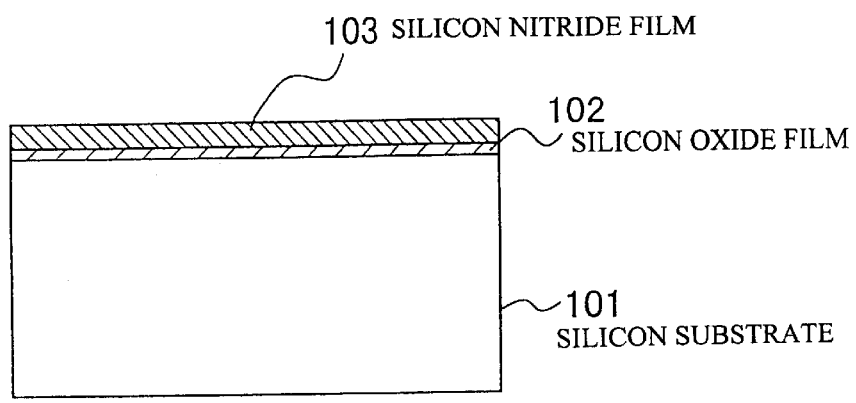
FIGS. 1A and 1B are cross-sectional views which illustrate the processes in the first example of the present invention.

Embodiments of present invention are described below, with reference being made to the relevant accompanying drawings.

FIG. 1 through FIG. 9 are drawings which show a specific example of the semiconductor device manufacturing method according to the present invention. These drawings show a method of manufacturing a semiconductor device, this method including a step whereby, before a gate oxide film 111 is formed, a thin oxide film (noted as an oxide film in the drawing) is left on the silicon substrate 101, a heavy metal 108 on the silicon substrate 101 being processed diffused into the silicon substrate 101 (step C in FIG. 6), and a step of forming a gate oxide film 111 on the silicon substrate 101 (step D in FIG. 6).

More specifically, as shown in FIG. 1A, a silicon oxide film 102 having a thickness between 10 and 100 nm and a silicon nitride film 103 having a thickness between 100 and 200 nm are formed on the silicon substrate 101.

Figure 1B:
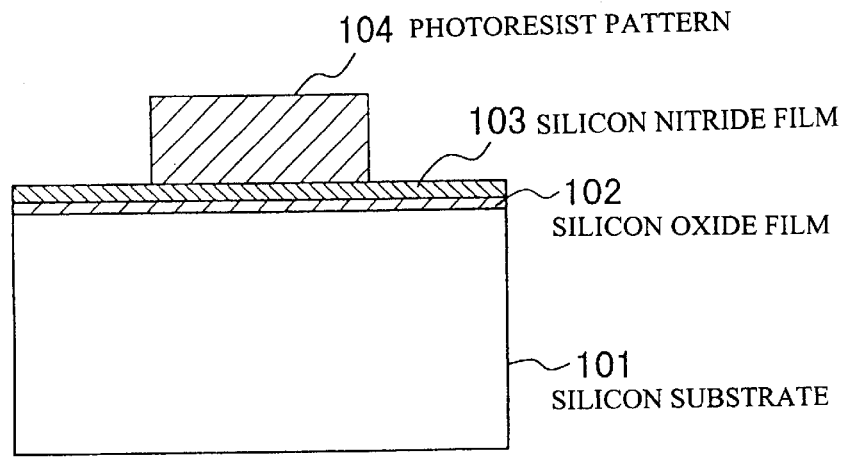
Figure 2A:
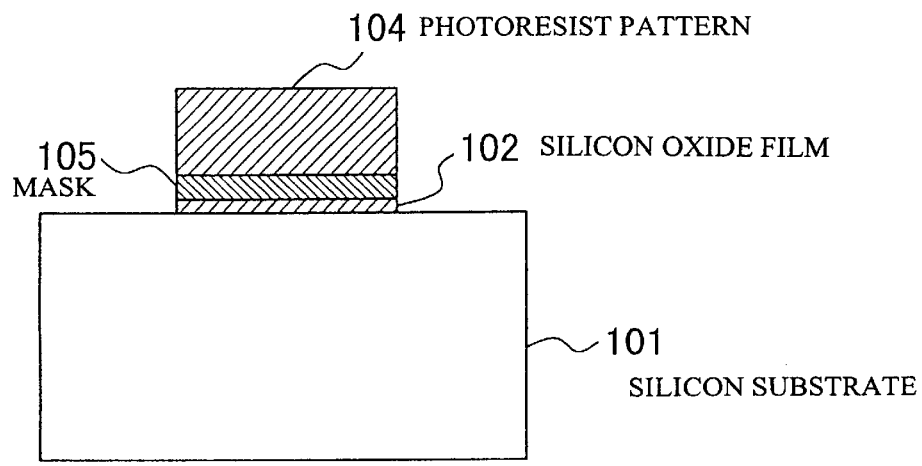
FIGS. 2A and 2B are cross-sectional views which illustrate subsequent processes in the first example of the present invention after those shown in FIGS. 1A and 1B.

Next, as shown in FIG. 1B, after application of photoresist, a known photolithographic technology is used to form a photoresist pattern 104 for the purpose of forming an element separation region. Additionally, as shown in FIG. 2A, a known dry etching technology is used to selectively remove the silicon nitride film 103, using the above-noted photoresist pattern 104 as a mask, thereby forming a mask pattern 105 of the silicon nitride film.

Figure 2B:
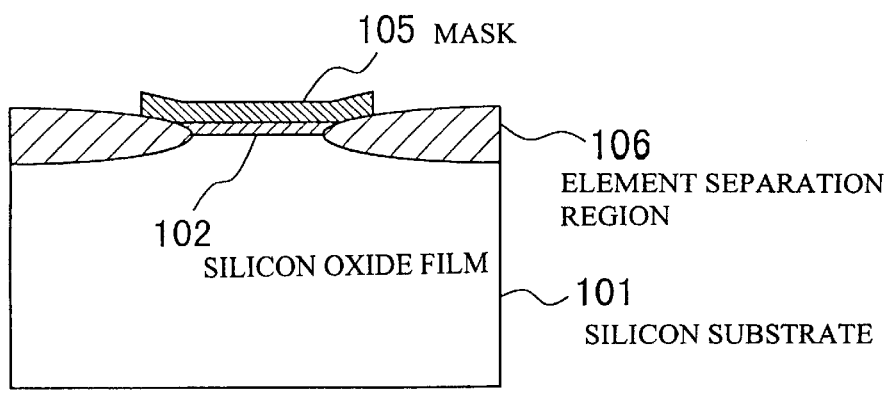

Next, as shown in FIG. 2B, after removing the photoresist mask 104, thermal oxidation is done to a thickness in the range from 300 to 500 nm at a temperature in the range from 900 to 1000° C., using LOCOS (local oxidation of silicon), thereby forming the element separation region 106.

Figure 3A:
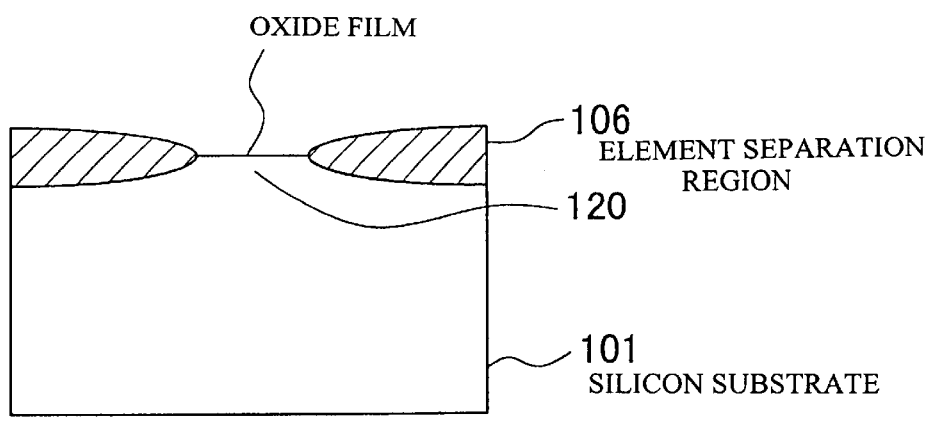
FIG. 3A and 3B are cross-sectional views which illustrate subsequent processes in the first example of the present invention after those shown in FIGS. 2A and 2B.
Figure 3B:
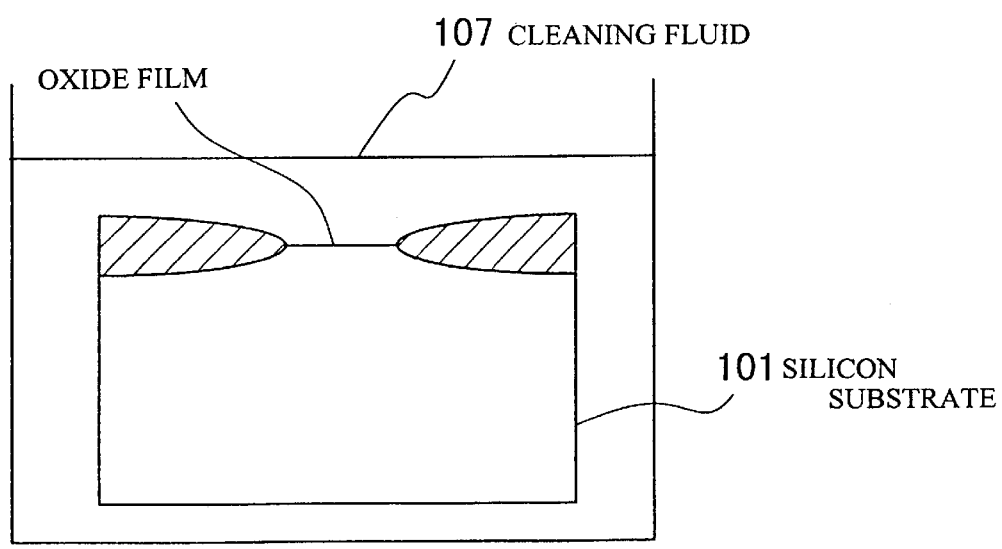

Then, wet etching using hydrofluoric acid or the like is done to remove the silicon nitride film 105 and silicon oxide film 102 and, as shown in FIG. 3B, cleaning before formation of the gate oxide film is done using a cleaning fluid 107, which is, for example, a fluid mixture of ammonia and hydrogen peroxide, a fluid mixture of sulfuric acid and hydrogen peroxide, or a fluid mixture of hydrochloric acid and hydrogen peroxide.

During this process, a thin natural oxide film is formed on the surface of the transistor region 120 which is surrounded by the element separation region 106, and otherwise a thin oxide film is formed by a cleaning solution which includes hydrogen peroxide.

Figure 4A:
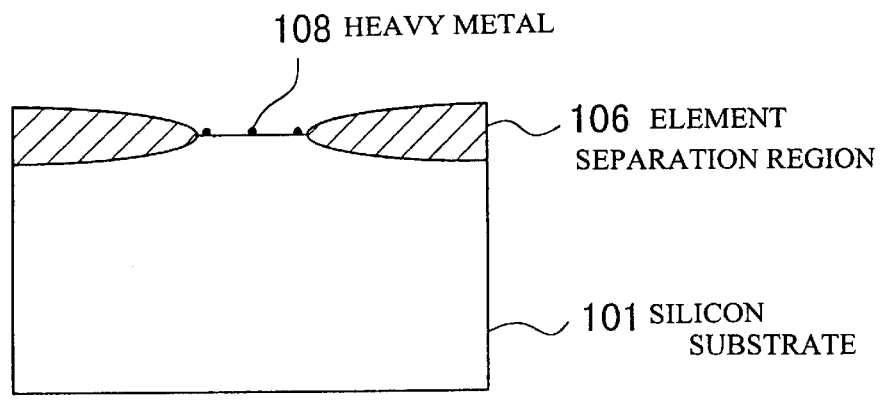
FIGS. 4A and 4B are cross-sectional views which illustrate subsequent processes in the first example of the present invention after those shown in FIGS. 3A and 3B.

When wet etching is done, if the cleaning fluid itself is contaminated with a heavy metal, as shown in FIG. 4A, the above-noted cleaning process will result in contamination of the surface of the silicon substrate 101 by the heavy metal 108. If gate oxidation is performed in this condition, the heavy metal 108 will remain in the gate oxide film, this causing a great deterioration of the reliability of the gate oxide film. Heat treating is therefore performed in the present invention to reduce the contamination by the heavy metal 108 which exists in the surface of the silicon substrate 101 before gate oxidation.

Figure 4B:
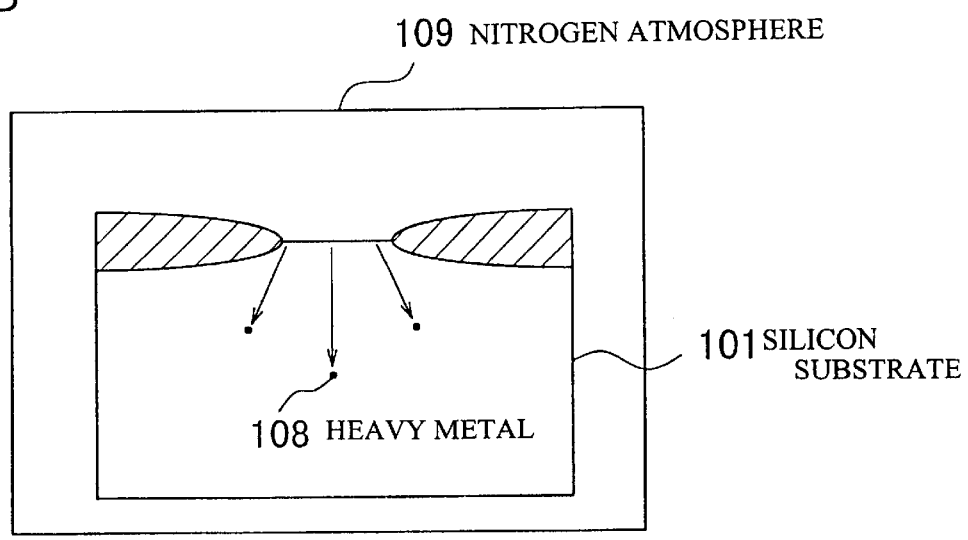

After the cleaning process, as shown in FIG. 4B RTA (rapid thermal annealing) of the silicon oxide film 101 is performed in a nitrogen atmosphere 109 containing 2% to 5% oxygen.

Figure 7:
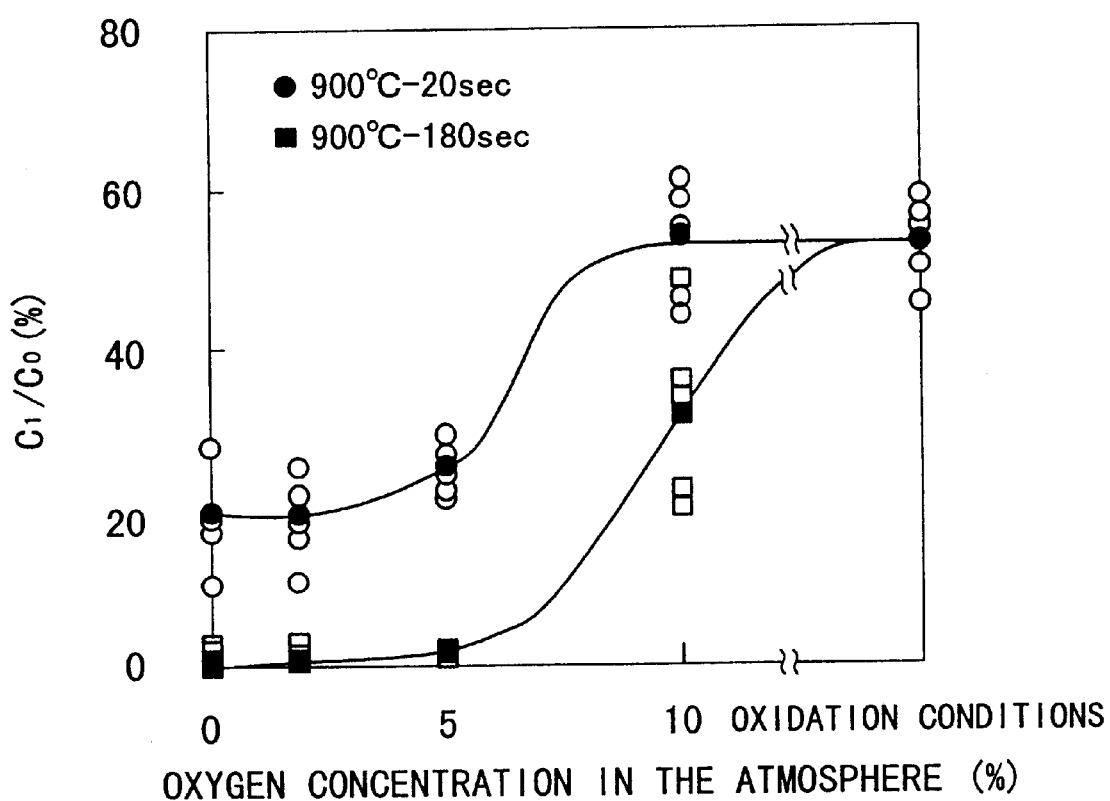
FIG. 7 is a graph which shows the relationship between oxygen concentration in the atmosphere in which nitrogen atmosphere oxidation is performed and the reduction ratio of surface iron contamination.

FIG. 7 shows relationship between the ratio of iron contamination existing in the surface of the silicon substrate 101 before the RTA process and after the RTA process and the oxygen concentration in the RTA process atmosphere, for the case of Fe contamination which is purposely imparted to the surface of the silicon substrate 101 (initial contamination concentration: $5 \times 10^{11}$ atoms/cm$^2$).

In FIG. 7, $C_0$ and $C_1$ are the Fe contamination concentrations of the silicon substrate surface before and after RTA treating, respectively.

As can be seen from FIG. 7, by performing RTA treating for 180 seconds in atmosphere having an oxygen concentration of 5% or lower at a process temperature of 900° C., it is possible to reduce the contamination concentration of the surface of the silicon substrate 101 to almost below the detectable limit. That is, it is seen that even if contamination to a level of $5 \times 10^{11}$ atoms/cm$^2$ occurs in the silicon substrate 101 surface, the above-noted RTA treating can reduce this to a contamination level of less than $1 \times 10^{11}$ atoms/cm$^2$.

Based on the studying the above-noted results, the RTA processing atmosphere used in the present invention was selected as a nitrogen atmosphere that contains 5% oxygen, and the RTA processing temperature and processing time were set to 900° C. and 180 seconds, respectively.

Figure 5A:
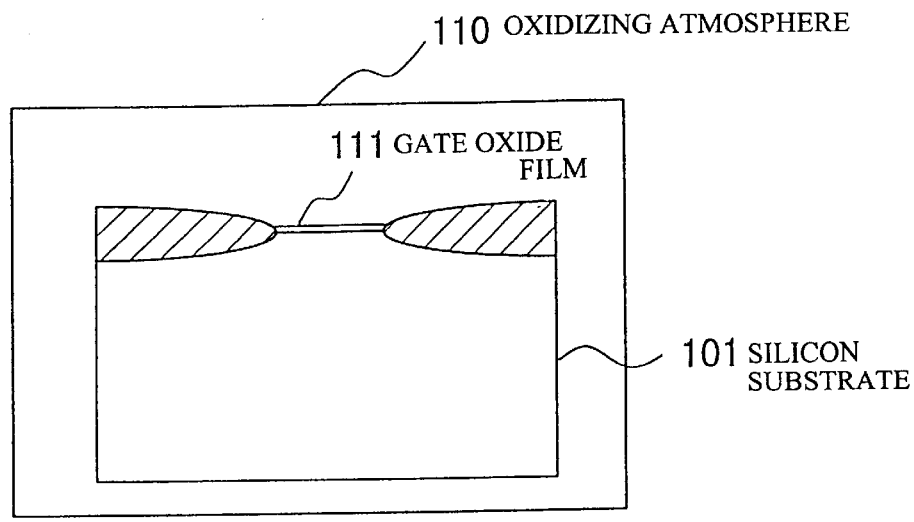
FIGS. 5A and 5B are cross-sectional views which illustrate subsequent processes in the first example of the present invention after those shown in FIGS. 4A and 4B.

After heat treating for the purpose of reducing the above-noted surface heavy metal contamination, as shown in FIG. 5A, the silicon substrate 101 is heated in an oxidizing atmosphere 110, thereby forming a gate oxide film 111 on the silicon substrate 101. When this is done, to prevent contamination during transport through the air from before the gate oxidizing (RTA processing) up until the gate oxide film formation, it is preferable that the gate oxide film be formed in the same reaction chamber in which the above-noted RTA processing was performed.

In this embodiment, after the above-noted RTA processing, the gas within the reaction chamber is changed to oxygen and RTO (rapid thermal oxidation) is done at, for example, 1050 to 1100° C. for 10 to 60 seconds, thereby forming a gate oxide film 111 of 5 to 10 nm.

Figure 5B:
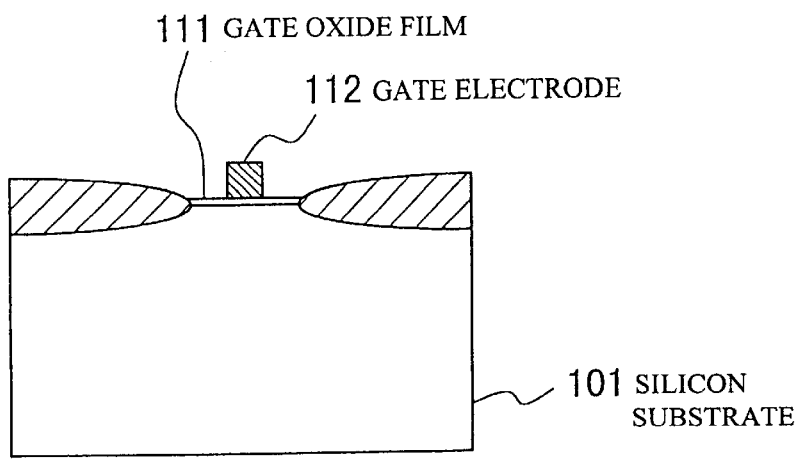
Figure 6:
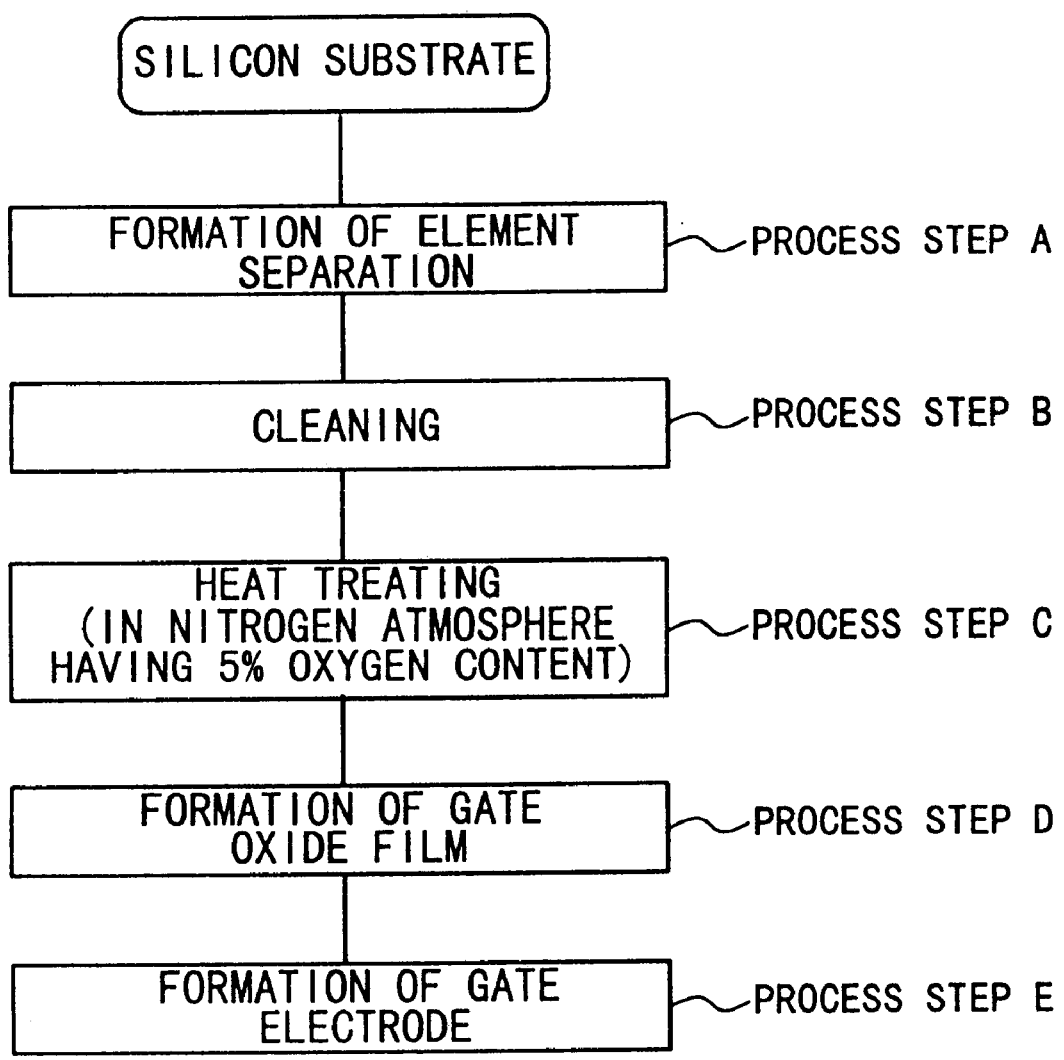
FIG. 6 is a flowchart which generally illustrates the first example of the present invention.

Then, using a known CVD process, a polysilicon film is formed and, using a known lithographic method and dry etching method, a gate electrode 112 is formed on the gate oxide film 111, as shown in FIG. 5B.

Figure 8:
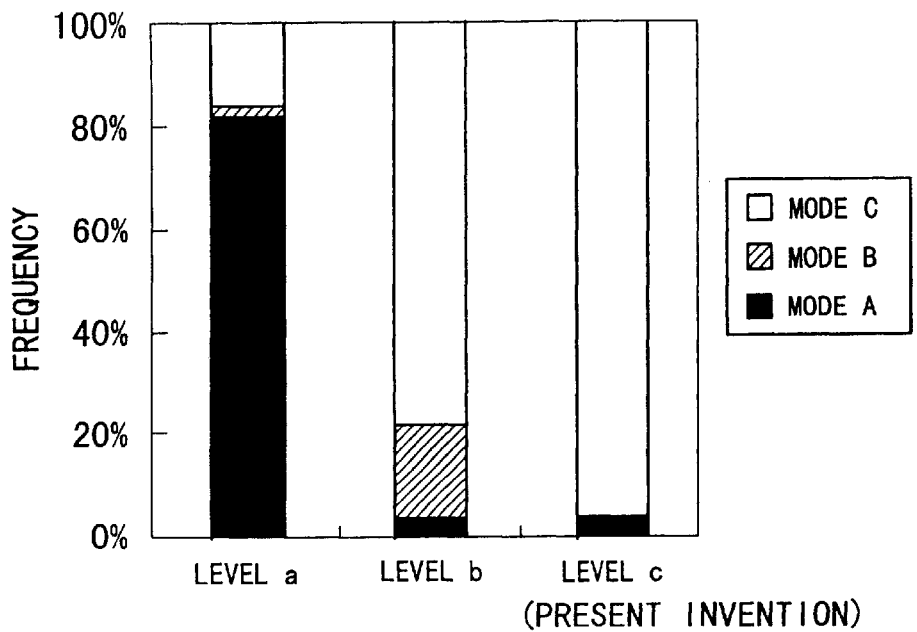
FIG. 8 is a graph which shows the breakdown voltage characteristics of a gate oxide film for the case in which the first example of the present invention is applied.

FIG. 8 shows the breakdown voltage characteristics of a semiconductor device obtained by intentionally imparting iron contamination (with an initial contamination concentration of $5 \times 10^{11}$ atoms/cm$^2$) to the surface of the silicon substrate 101 before oxidation, and then performing RTA and RTO processing (level c) as was described above.

By way of comparison, measurements were performed with regard to the case of forming a gate oxide film (level a) after iron contamination without performing RTA processing, and the case of performing RTA processing in a 100% nitrogen atmosphere (level b).

The breakdown failure modes were defined as mode A corresponding to 0 to 5 (MV/cm), mode B corresponding to 4 to 8 MV/cm, and mode C for values of 8 MV/cm or higher.

As can be seen from this drawing, in the case in which heat treating is not performed before oxidation (level a), mode A almost always resulted. In contrast to this, in the case of the embodiment (level c), mode C failure resulted more than 95% of the time, thereby indicating the effect of improving the breakdown voltage.

This is because, compared to the case in which heat treating is not done before oxidation, the gate oxide film includes almost no heavy metal contamination, this greatly contributing to an improvement in the breakdown voltage characteristics of the gate oxide film.

In the case in which RTA processing is performed in a 100% nitrogen atmosphere (level b), although an improvement is observed in the breakdown voltage, there are new mode B failures.

Figure 9:
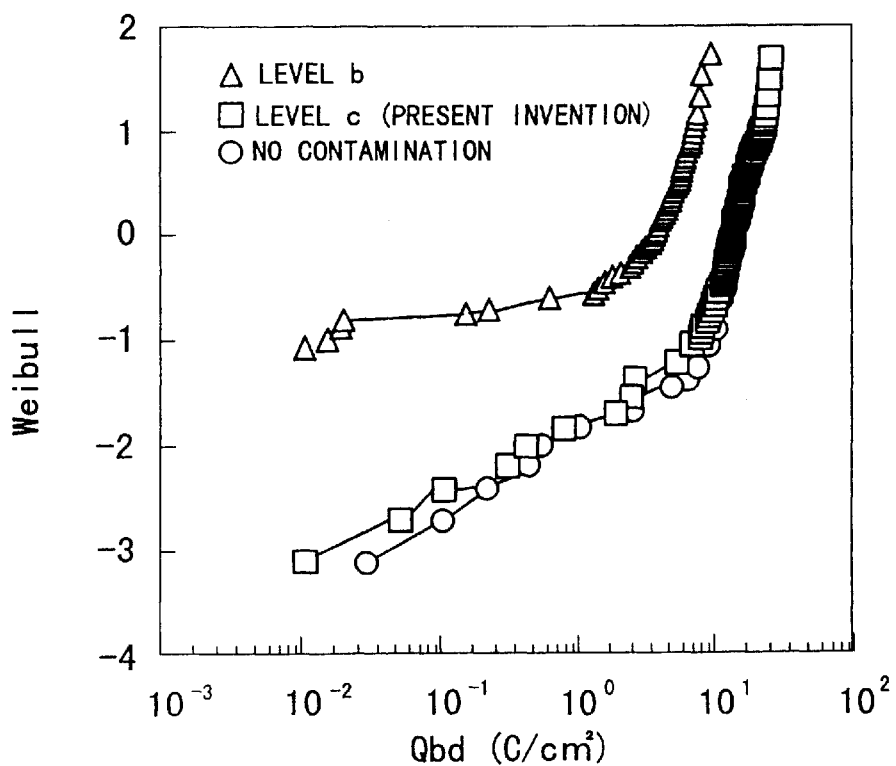
FIG. 9 is a graph which shows the TDDB characteristics of a gate oxide film for the case in which the first example of the present invention is applied.

FIG. 9 shows the TDDB characteristics. In contrast to TDDB characteristics that are equivalent to the case in which iron contamination was not imparted at level c in the present invention (i.e., the case of no contamination), when RTA processing is performed in a 100% nitrogen atmosphere (level b), there is a clear-cut reduction seen in the Qbd value (the charge needed to be implanted to bring about a breakdown of the gate oxide film).

The reason for this thought to be that, while there is a reduction in the heavy metal contamination of the surface of the silicon substrate 101, there is an increase in the microroughness of the surface of the silicon substrate, which causes a deterioration of the gate oxide film material.

In the heat treating in a nitrogen atmosphere which contains 2% to 5% oxygen performed before forming of the gate oxide film, because heat treating conditions are set so that a natural oxide film or chemical oxide film which is formed before gate oxidation process is not removed, there is no deterioration of the film material, such as non-uniformity of the oxide film thickness caused by an increase in the microroughness of the substrate surface.

As described above, according to the present invention it is possible to obtain a high-quality gate oxide film, even in the case in which there is inadvertent contamination which occurs before the gate oxidation.

Figure 10:
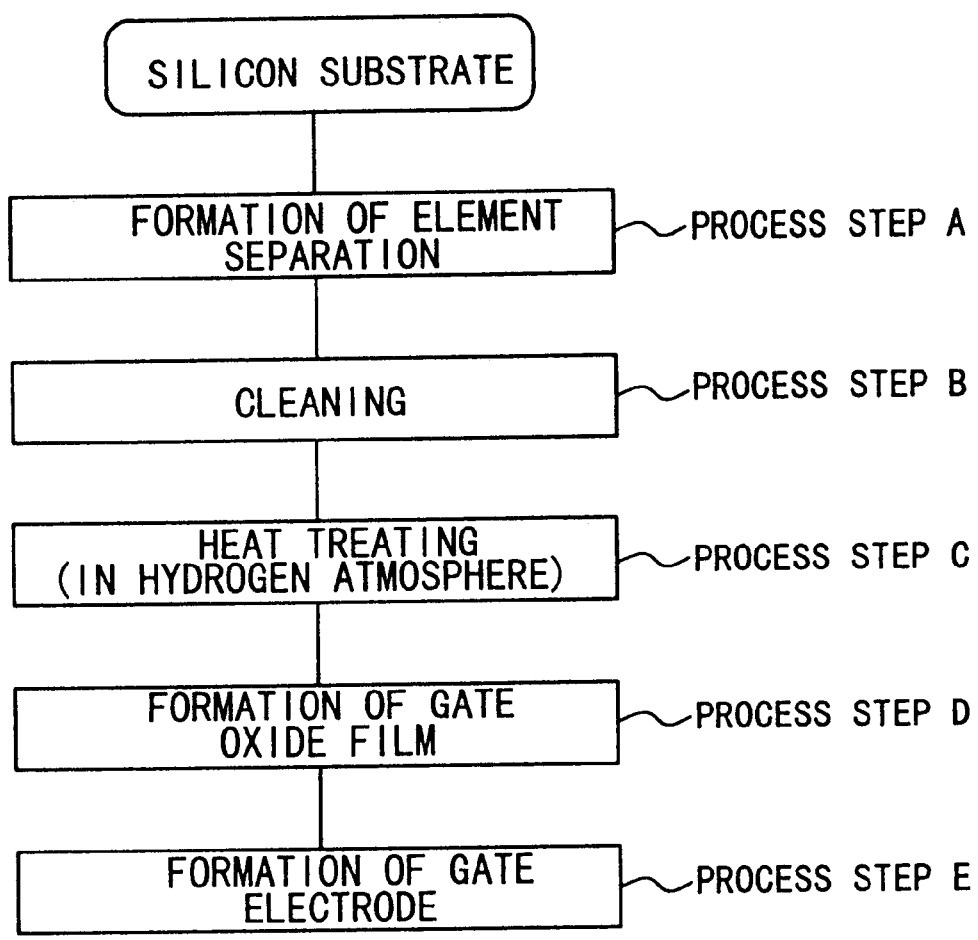
FIG. 10 is a flowchart which generally illustrates the second example of the present invention.

The second embodiment of a method of manufacturing a semiconductor device according to the present invention is shown in simplified form in the flowchart of FIG. 10.

In the processes of this embodiment, heat treating before oxidation is performed in a hydrogen atmosphere, the various cross-sectional views for each process being described below in terms of the drawing used to describe the first embodiment.

After process steps that are the same as described with regard to the first embodiment (FIG. 1 through FIG. 4A) and after proceeding to the process B (cleaning) that is shown in FIG. 10, in the process step C (heat treating), heat treating of the silicon substrate 101 is performed in a hydrogen atmosphere (cross-sectional view of FIG. 4B).

When this is done, the heat treating temperature is established so that the natural (chemical) oxide film that exists on the surface of the silicon substrate 101 is not removed by a reduction reaction, this being set in the range from 800 to 1050° C.

In this embodiment, heat treating and RTA are used, the heat treating temperature being set to 950° C. and the treating time being set to 180 seconds.

As a result, it is possible to diffuse the heavy metal into the silicon substrate without causing microroughness on the surface of the silicon substrate 101. Then, proceeding to the process step D which is shown in FIG. 10, the silicon substrate 101 is heated in an oxidizing atmosphere, so as to form a gate oxide film 111 on the surface of the substrate (cross-sectional view of FIG. 5A).

With regard to the process steps C and D shown in FIG. 10, these are performed in one and the same reaction chamber, as described with regard to the first embodiment.

In this embodiment, after the above-noted RTA processing, the gas within the reaction chamber is changed to oxygen, and RTO is performed at, for example, 1050° C. to 1100° C. for 10 to 60 seconds, thereby forming a gate oxide film 111 of 5 to 10 nm.

Then, proceeding to the process step E of FIG. 10, a known CVD method is used to form a polysilicon film and a known lithographic method is used to form a gate electrode 112 on the gate oxide film 111 (cross-sectional view of FIG. 5B).

The third embodiment will be described next, with reference being made to FIG. 11 through FIG. 14.

In the present invention, if there is heavy metal contamination in the device activated region, the heavy metal that is diffused into the substrate by heat treating before gate oxidation, this serves as a center for generation and re-joining of carriers, and which can cause a worsening of the current versus voltage characteristics of the semiconductor device, such as junction leakage current.

A feature of the third embodiment of the present invention is that a gettering site is formed beforehand on the silicon substrate using high-energy ion implantation, so as to effectively eliminate heavy metal contamination, which is diffused into the substrate by heat treating, from the device activation region.

Figure 11:
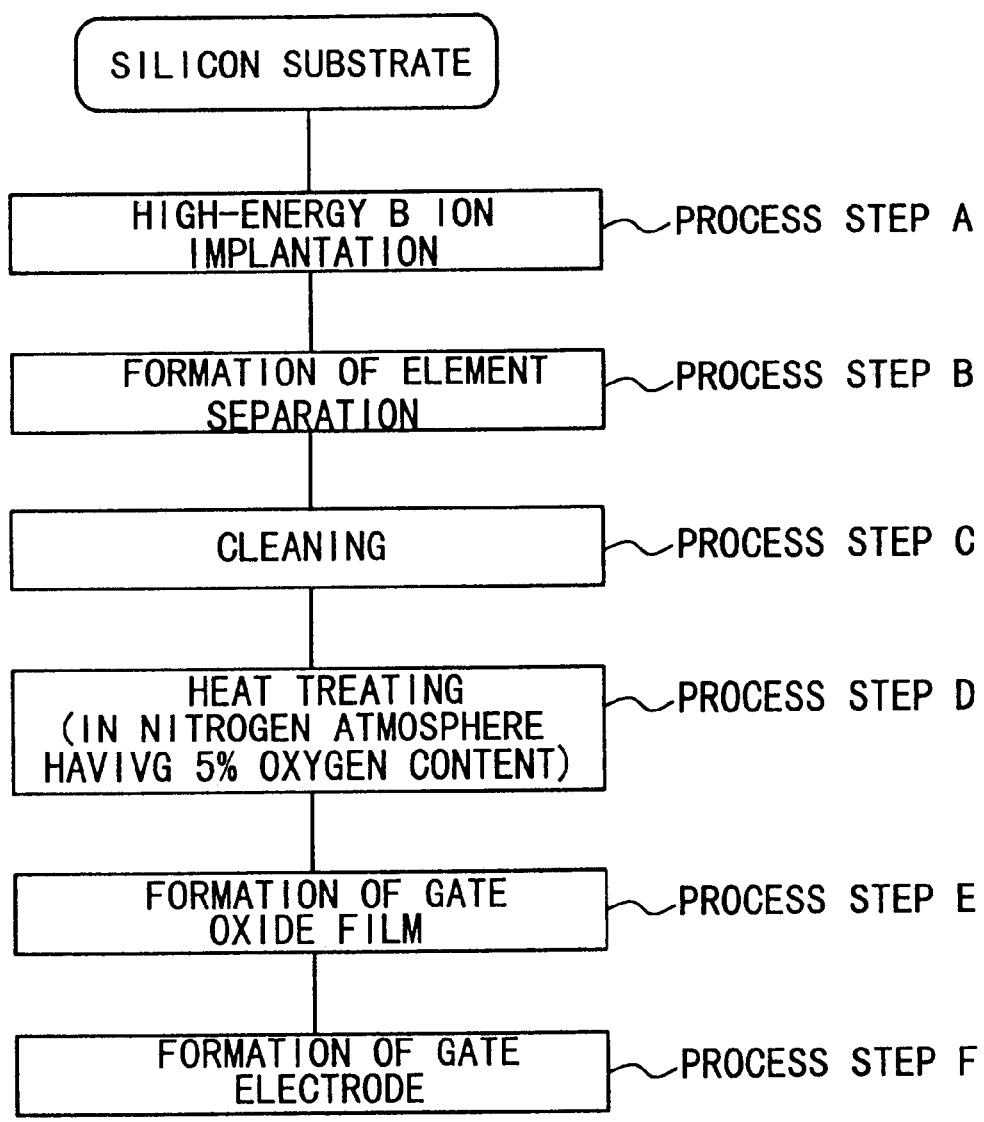
FIG. 11 is a flowchart which generally illustrates the third example of the present invention.
Figure 13A:
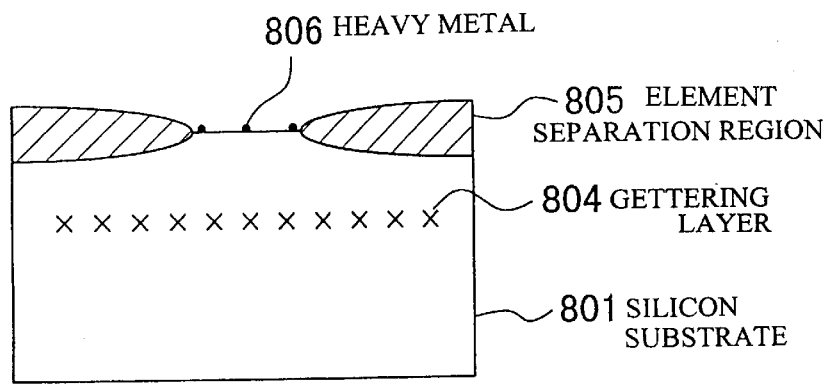
FIGS. 13A and 13B are cross-sectional views which show subsequent processes in the third example of the present invention, after those shown in FIGS. 12A and 12B.
Figure 13B:
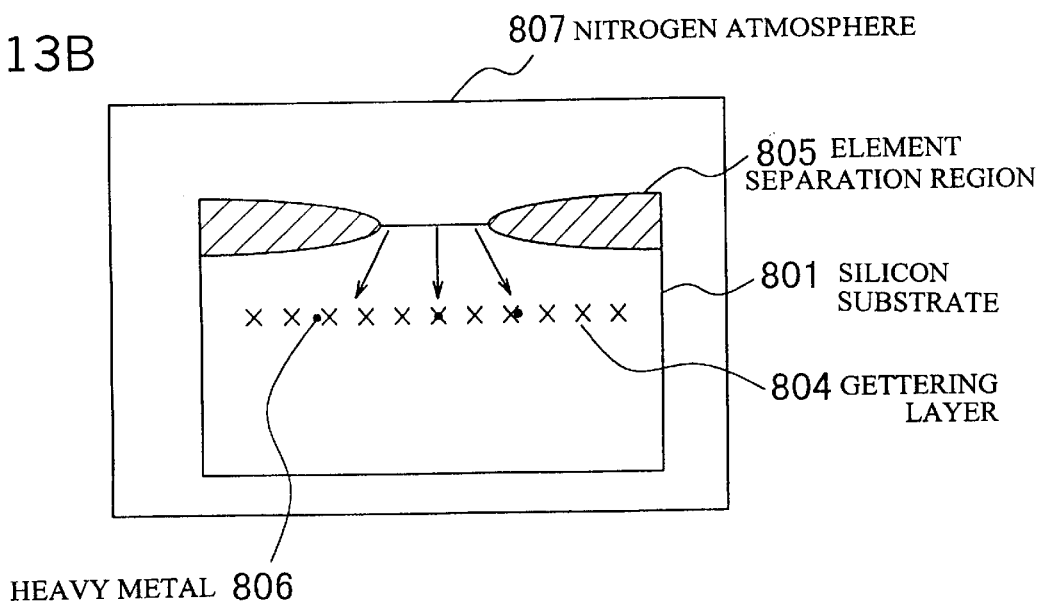
Figure 14:
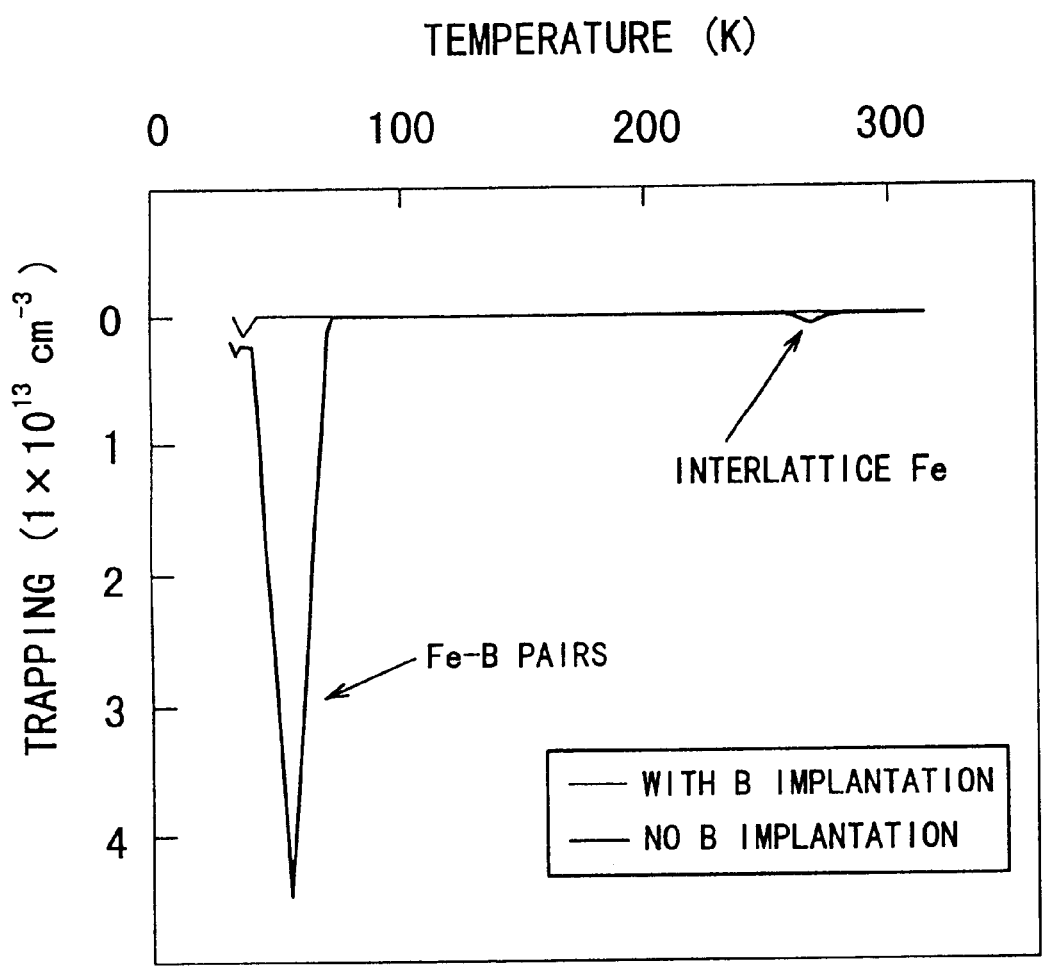
FIG. 14 is a graph which shows the results of measuring iron concentration existing within the silicon substrate using DLTS, for the case of application of the third example of the present invention.
Figure 15A:
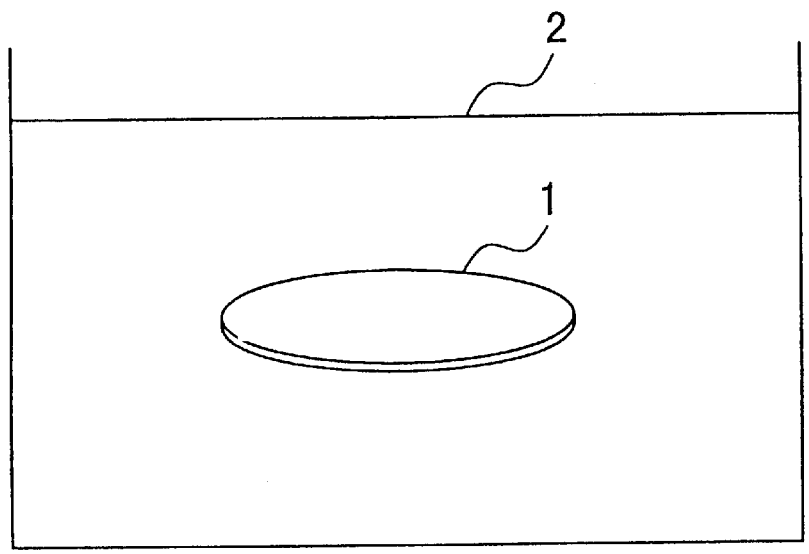
FIGS. 15A and 15B are schematic diagrams which illustrate the prior art.
Figure 15B:
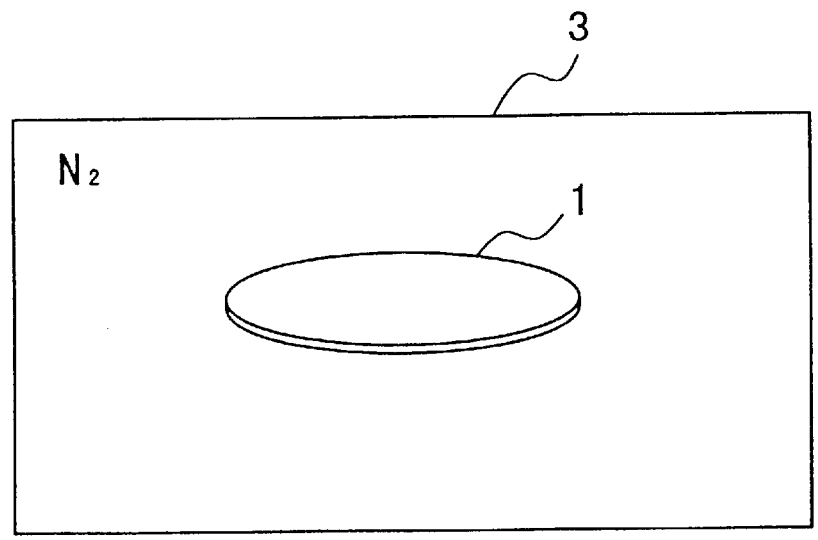
Figure 16A:
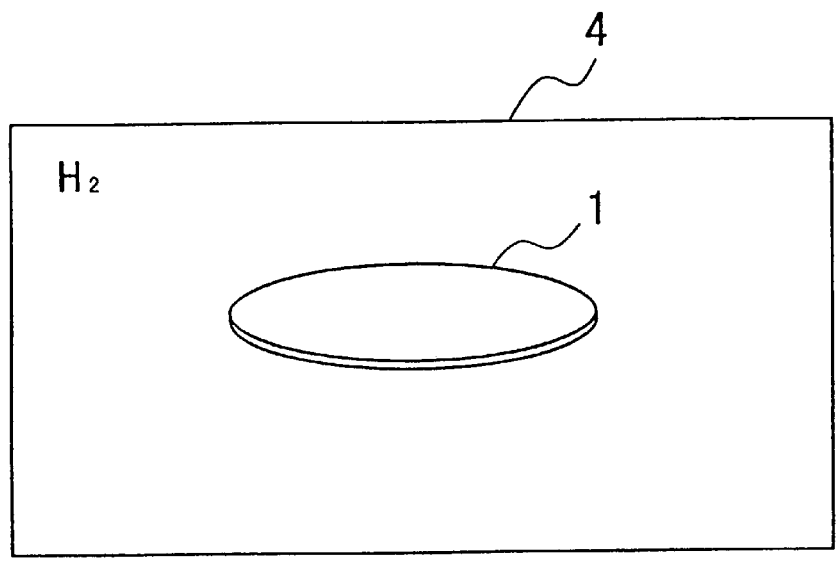
FIGS. 16A and 16B are schematic diagrams which illustrate the prior art.
Figure 16B:
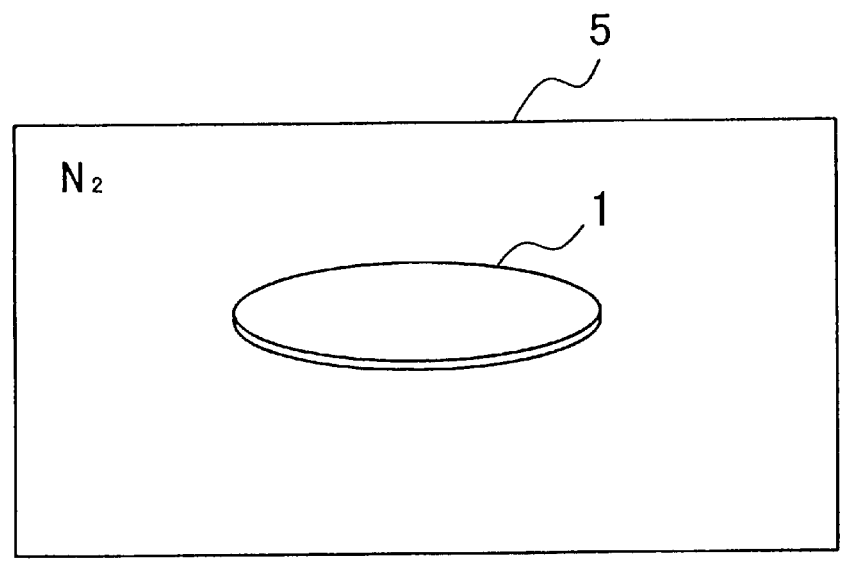
Figure 17:
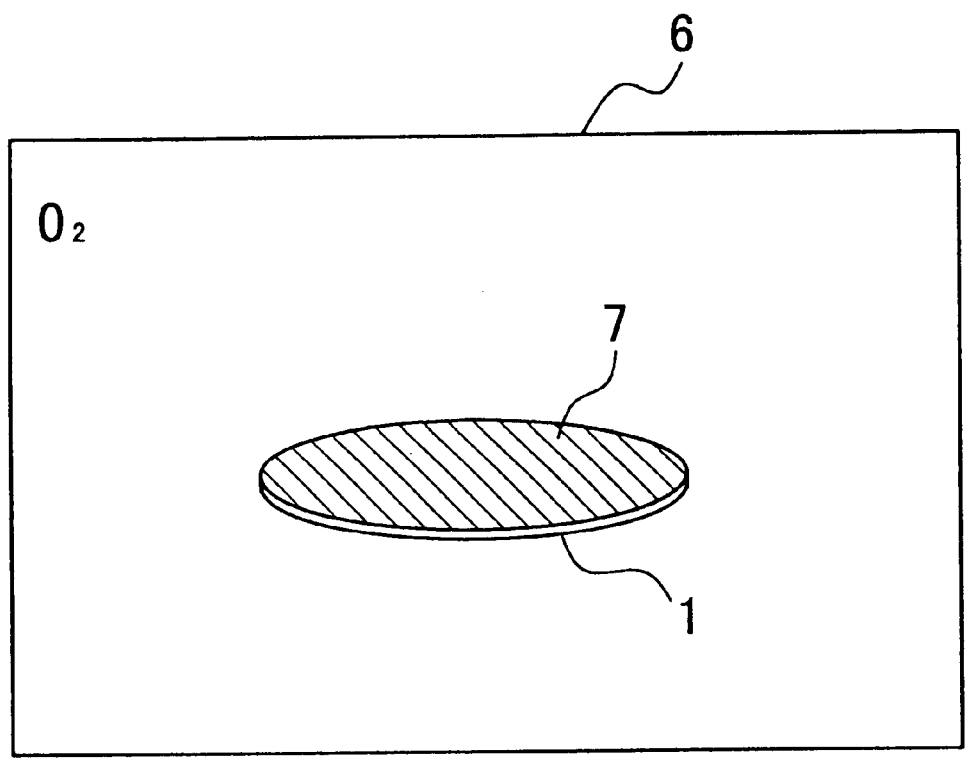
FIG. 17 is a schematic diagram which illustrates the prior art.

The flowchart shown in FIG. 11 is a general representation of the third embodiment of a method of manufacturing a semiconductor device according to the present invention. FIG. 12 through FIG. 14 show cross-sectional views of the various process steps in this embodiment.

As shown in FIG. 11, because after the formation of the element separation (process steps B through F) in this example follow the manufacturing process steps of the first example (process steps A through E of FIG. 6), these parts will be described using FIG. 1 through FIG. 5.

Figure 12A:
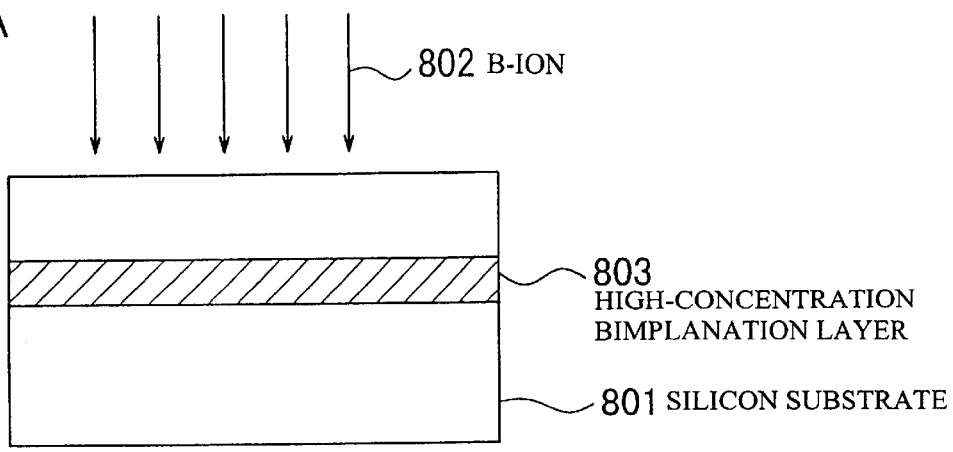
FIGS. 12A and 12B are cross-sectional views which show the processes, illustrating the third example of the present invention.

First, as shown in FIG. 12A, B (boron) ions 802 are implanted into a silicon substrate 801, thereby forming a high-concentration B implantation layer 803 within the silicon substrate 801.

Figure 12B:
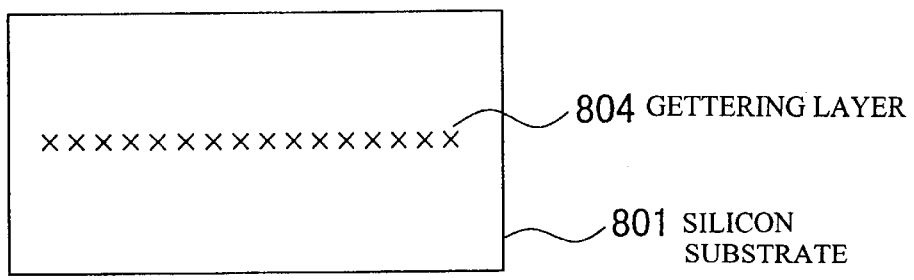

The implantation conditions are established as an implantation energy of 2.4 MeV (implantation projection range: 3 μm), and a implantation dose of $1 \times 10^{15}$ atoms/cm$^2$. Next, as shown in FIG. 12B heat treating of the silicon substrate 801

(RTA processing) is performed for 30 seconds at a temperature of 1050° C., for example, in a nitrogen atmosphere.

By means of this heat treating, a gettering layer (implantation depletion layer) 804 is formed in the above-noted high-concentration B implantation layer 803. Then, after process steps that are the same as the first example of the present invention (FIG. 1 through FIG. 5), the element separation region is formed and cleaning is performed before gate oxide film formation. When doing this, if there is heavy metal contamination of the cleaning fluid itself, as shown in FIG. 13A, the surface of the silicon substrate 801 will be contaminated by the heavy metal 806 by means of the cleaning. Because of this problem, as shown in FIG. 13B, the next step is to perform heat treating (RTA processing) of the silicon substrate 801 in a nitrogen atmosphere having 5% oxygen concentration.

The heat treating temperature and time were set to 900° C. and 180 seconds, respectively. In this example of the present invention, because a gettering site 804 is formed beforehand by high-energy B ion implantation, the heavy metal element 806 that is diffused into the substrate from the surface of the silicon substrate 801 is captured by this gettering site 804.

Then, after process steps similar to the first embodiment (FIGS. 5A and 5B), the gate oxide film and gate electrode are formed.

FIG. 14 shows the measurement results that were obtained for the case of intentionally imparting iron contamination (initial contamination concentration of $5 \times 10^{11}$ atoms/cm$^2$) to the surface of a silicon substrate before gate oxide film formation and performing the heat treating and gate oxidation indicated in this embodiment, the amount of iron within the substrate 801 being measured by DLTS (deep level transient spectroscopy). The amount of iron existing within the substrate is shown as the sum of Fe-B pairs and the trap density detected as interlattice Fe.

In contrast to an observed iron concentration of approximately $4 \times 10^{13}$ atoms/cm$^2$ in a CZ substrate with respect to which high-energy ion implantation is not done, in a CZ substrate which is subjected to high-energy B ion implantation, trapping was below the limit of detection ($1 \times 10^{10}$ atoms/cm$^2$).

Thus, when a gate oxide film is formed in the present invention, by using a silicon substrate having a gettering site formed by high-energy ion implantation, it is possible to effectively remove heavy metal contamination in the surface of the silicon substrate and inside the silicon substrate (in the device activation region).

It is therefore possible to prevent a deterioration of the breakdown voltage characteristics and junction leakage characteristics of the gate oxide film, the result being an improvement in both semiconductor device yield and reliability.

Although the above-noted three embodiment of the present invention were described for the case of using heat treating in a nitrogen atmosphere having 2% to 5% oxygen and heat treating in a hydrogen atmosphere at a temperature not exceeding 1050° C., the present invention does not impose a restriction in this respect, and enables the application of heat treating in a helium atmosphere or in an argon atmosphere in any embodiment thereof.

According to the present invention as described in detail above, by performing heat treating before performing gate oxidation, heavy metal contamination elements in the surface of the silicon substrate are diffused into the substrate, thereby reducing the contamination concentration in the substrate surface to a sufficiently low level.

Therefore, even in the case in which contamination of the substrate surface occurs before gate oxidation, there is almost no trapping of heavy metals into the gate oxide film when the gate oxide film is formed.

In the heat treating in a hydrogen atmosphere performed before forming of the gate oxide film, because heat treating conditions are set so that a natural oxide film or chemical oxide film which is formed before gate oxidation process is not removed, there is no deterioration of the film material, such as non-uniformity of the oxide film thickness caused by an increase in the microroughness of the substrate surface.

In the same manner, in the heat treating in a nitrogen atmosphere performed before forming of the gate oxide film, because the heat treating conditions are set so that etching and nitriding of the substrate surface do not occur, it is possible to prevent a deterioration of the gate oxide film material.

In view of the above, it can be seen that the present invention enables the formation of a clean, high-quality gate oxide film, thereby enabling the formation of a gate oxide film with a high breakdown voltage, this having the effect of improving both the yield and the reliability of the semiconductor device.

What is claimed is:

1. A method for manufacturing a semiconductor device comprising the steps of:
   a first step of leaving a thin oxide film on a silicon substrate onto which it is formed and of diffusing a heavy metal at a surface of said silicon substrate into the silicon substrate by heat treating the substrate in a nitrogen atmosphere containing 2% to 5% oxygen at a temperature of at least 800° C. but no greater than 900° C., before forming a gate oxide film; and
   a second step of forming a gate oxide film onto said silicon substrate.

2. A method of manufacturing a semiconductor device according to claim 1, wherein said first step and said second step are performed in one and the same reaction chamber.

3. A method of manufacturing a semiconductor device according claim 1, wherein said thin oxide film that is formed on said substrate is a natural oxide film or an oxide film that is formed by a cleaning solution which includes hydrogen peroxide.

4. A method of manufacturing a semiconductor device according to claim 3, wherein said cleaning solution that includes hydrogen peroxide is at least one mixed solution selected from a group consisting of a fluid mixture of ammonia and hydrogen peroxide, a fluid mixture of sulfuric acid and hydrogen peroxide, and a fluid mixture of hydrochloric acid and hydrogen peroxide.

5. A method of manufacturing a semiconductor device comprising the steps of:
   a first step of forming an element separation region on a semiconductor substrate for the purpose of forming a semiconductor device;
   a second step of cleaning a surface of said semiconductor substrate before forming a gate oxide film within the element separation region of said semiconductor substrate;
   a third step of performing heat treating in a nitrogen atmosphere containing 2% to 5% oxygen at a temperature of at least 800° C. but no greater than 900° C. for the purpose of reducing the amount of heavy metal existing in the surface of said semiconductor substrate;
   a fourth step of forming a gate oxide film within said element separation region; and a fifth step of forming a gate electrode on said gate oxide film.

6. A method of manufacturing a semiconductor device according to claim 5, wherein a gettering site is formed within said semiconductor substrate by high-energy ion implantation before performing said first step.

7. A method of manufacturing a semiconductor device according to claim 5, wherein said third step and said fourth step are performed in one and the same reaction chamber.

8. A method of manufacturing a semiconductor device according to claim 5, wherein prior to said heat treating step a thin oxide film is formed on said substrate as a natural oxide film or as an oxide film that is formed by a cleaning solution which includes hydrogen peroxide.

9. A method of manufacturing a semiconductor device according to claim 8, wherein said cleaning solution that includes hydrogen peroxide is at least one mixed solution selected from a group consisting of a fluid mixture of ammonia and hydrogen peroxide, a fluid mixture of sulfuric acid and hydrogen peroxide, and a fluid mixture of hydrochloric acid and hydrogen peroxide.

* * * * *